(12) United States Patent
Dimitrov et al.

(10) Patent No.: US 7,027,270 B2
(45) Date of Patent: Apr. 11, 2006

(54) SPIN VALVE SENSOR FOR HIGH AREAL DENSITY APPLICATIONS

(75) Inventors: Dimitar V. Dimitrov, Edina, MN (US); Insik Jin, Edina, MN (US); Declan Macken, Prior Lake, MN (US); Robert W. Lamberton, Limavady (IE); Xuefei Tang, Eden Prairie, MN (US); Johannes van Ek, Minnetonka, MN (US); Thomas R. Boonstra, Chaska, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 261 days.

(21) Appl. No.: 10/208,509

(22) Filed: Jul. 30, 2002

(65) Prior Publication Data

US 2003/0112562 A1 Jun. 19, 2003

Related U.S. Application Data

(60) Provisional application No. 60/344,826, filed on Dec. 14, 2001.

(51) Int. Cl.
*G11B 5/127* (2006.01)

(52) U.S. Cl. ..................................................... 360/320
(58) Field of Classification Search .................. 360/320
See application file for complete search history.

(56) References Cited

U.S. PATENT DOCUMENTS 5,707,538 A    1/1998  Shen et al. .................... 216/22
5,880,910 A    3/1999  Shouji et al. ................ 360/113
5,972,420 A  * 10/1999  Saito et al. .................. 427/130
6,094,325 A    7/2000  Tagawa et al. ............. 360/113
6,201,465 B1    3/2001  Saito et al. ............... 338/32 R
6,229,678 B1    5/2001  Xue et al. .............. 360/327.22
2001/0014001 A1    8/2001  Aoshima et al. ........ 360/327.32
2004/0037014 A1  *  2/2004  Mauri et al. ................. 360/322

OTHER PUBLICATIONS

"Allicat Magnetoresistive Head Design and Performance", IEEE Transactions on Magnetics, vol. 30, No. 2, Mar. 1994.

"Stability and Biasing Characteristics of A Permanent Magnet Biased SAL/MR Device", IEEE Transactions on Magnetics, vol. 30, No. 6, Nov. 1994.

"The Era of Giant Magnetoresistive Heads", http://www-.strorage.ibm.com/hdd/technolo/gmr/gmr.htm.

\* cited by examiner

*Primary Examiner*—George Letscher
(74) *Attorney, Agent, or Firm*—Kinney & Lange, P.A.

(57) ABSTRACT

The magnetoresistive sensor has a bottom shield, a nonmagnetic metallic pedestal, a bottom reader gap, a biasing element, a magnetoresistive stack, current leads, a top reader gap, and a top shield. The nonmagnetic metallic pedestal is positioned on a portion of the bottom shield and the nonmagnetic metallic pedestal has a width less than the width of the bottom shield. The bottom reader gap is positioned on the nonmagnetic metallic pedestal and on the bottom shield such that a portion of the bottom reader gap over the nonmagnetic metallic pedestal is raised relative to portions of the bottom reader gap not over the nonmagnetic metallic pedestal.

25 Claims, 3 Drawing Sheets

SPIN VALVE SENSOR FOR HIGH AREAL DENSITY APPLICATIONS

CROSS-REFERENCE TO RELATED APPLICATION(S)

This application claims priority from Provisional U.S. Patent Application No. 60/344,826, filed on Dec. 14, 2001 for "SPIN VALVE SENSOR FOR HIGH AREAL DENSITY APPLICATIONS" for Dimitar V. Dimitrov, Insik Jin, Declan Macken, Robert W. Lamberton, Xuefei Tang, Johannes Van Ek, and Thomas R. Boonstra, which is hereby incorporated by reference.

BACKGROUND OF THE INVENTION

The present invention relates generally to the field of electronic data storage and retrieve systems. In particular, the present invention relates to a magnetoresistive read sensor having improved thermal and magnetic stability.

In an electronic data storage and retrieval system, a transducing head typically includes a reader portion having a magnetoresistive (MR) sensor for retrieving magnetically-encoded information stored on a magnetic disc. MR sensors may be anisotropic magnetoresistive (AMR) sensors or giant magnetorisistive (GMR) sensors. AMR sensors generally have a single MR layer formed of a ferromagnetic material. GMR sensors generally have multiple layers or a "stack" of ferromagnetic material.

A GMR stack generally consists of a free layer and a pinned layer, which are comprised of magnetic material. The pinned layer has a magnetization vector that is pinned and cannot rotate. The free layer on the other hand, has a magnetization vector that is allowed to rotate relative to the pinned layer. When a GMR sensor is placed in close proximity to a rotating magnetized storage disc, the free layer is exposed to magnetic bit fields previously written on the magnetic surface. Exposing the free layer to the magnetic bit fields in this way, affects the magnetization vector of the free layer, which then rotates relative to the magnetization vector of the pinned layer. When a current is passed through the GMR stack, changes in resistance are detected as voltage changes. The change in resistance is due to the changing magnetization vector of the free layer relative to the pinned layer. External circuitry then converts the voltage information into an appropriate format and manipulates that information into a series of binary ones and zeros that represent the recorded bits on the storage disc.

Information that is read by the GMR sensor is initially stored on the magnetic discs in tracks. The magnetic recording industry has been continually doubling the amount of information stored in a unit area of the magnetic disc for a prolonged period of time. A measure of the amount of information stored in a unit area is often referred to as the areal density. The areal density is a reflection of the number of bits written in a particular unit area. In order to accommodate ever increasing areal density, improvements have been made in the magnetic media, and transducing heads have been decreased in size.

Even though transducing head dimensions have decreased by orders of magnitude, the output signals have been required to remain consistent. In order to obtain consistent read-back amplitudes with much smaller transducers, GMR sensors with much higher GMR ratios have been required. Also, thickness of the reader gaps in the GMR sensors has been decreased. Similarly, the free layer thickness and corresponding permanent magnet biasing element thickness has been decreasing to provide more free layer magnetization rotation and larger efficiency.

Even with these significant design and process improvements, improved designs are needed to provide consistent output signals, increase stability of MR sensors, and decrease the overall head size.

BRIEF SUMMARY OF THE INVENTION

The present invention introduces an improved magnetoresistive sensor for use in a magnetic storage system, and a method for making the same. The magnetoresistive sensor has a bottom shield, a nonmagnetic metallic pedestal, a bottom reader gap, a permanent magnet element, a magnetoresistive stack, current leads, a top reader gap, and a top shield.

The nonmagnetic metallic pedestal is positioned on a portion of the bottom shield. The bottom reader gap is positioned on the nonmagnetic metallic pedestal and on the bottom shield such that a portion of the bottom reader gap over the nonmagnetic metallic pedestal is raised relative to portions of the bottom reader gap not over the nonmagnetic metallic pedestal. The nonmagnetic metallic pedestal gives the magnetoresistive sensor a unique configuration that leads to greater magnetic stability, higher read-back amplitude and overall improved performance.

DETAILED DESCRIPTION

Figure 1:
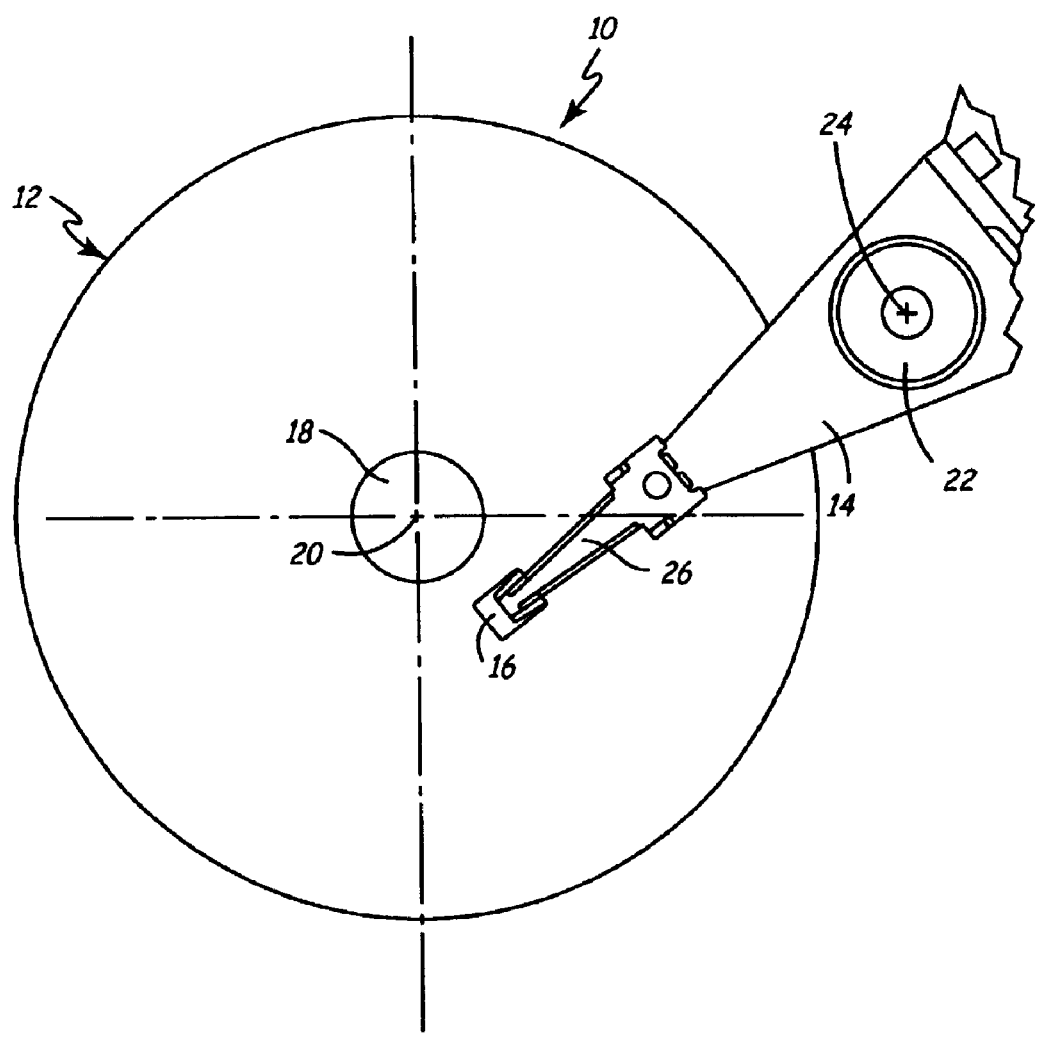
FIG. 1 is a diagram of a disc drive.

The present invention may be used in a disc drive system 10 as exemplified in FIG. 1. Disc drive 10 includes at least one disc 12 and actuator arm 14 with slider 16. Disc 12 is mounted on drive spindle 18, and during use of disc drive 10, disc drive spindle 18 rotates disc 12 about axis 20. Actuator arm 14 is mounted on servo spindle 22 and is pivotable about axis 24 by an actuator such as a voice coil motor (not shown). Actuator arm 14 extends parallel to the plane of disc 12 and carries at least one flexure or suspension arm 26. Suspension arm 26 supports air bearing slider 16 adjacent a surface of disc 12.

As disc 12 rotates about axis 20, the aerodynamic properties of slider 16 cause it to "fly" above the surface of disc 12. Slider 16 is supported on a thin cushion of air between the surface of disc 12 and the air bearing surface of slider 16.

A giant magnetoresistive (GMR) sensor may be fabricated on the trailing edge of slider 16, and positioned as close as possible to rotating disc 12. Pivoting of actuator arm 14 moves slider 16 through an arc, and allows the GMR sensor fabricated on slider 16 to change track positions on disc 12. The GMR sensor may then be employed for reading magnetically stored information from the surface of disc 12.

Figure 2:
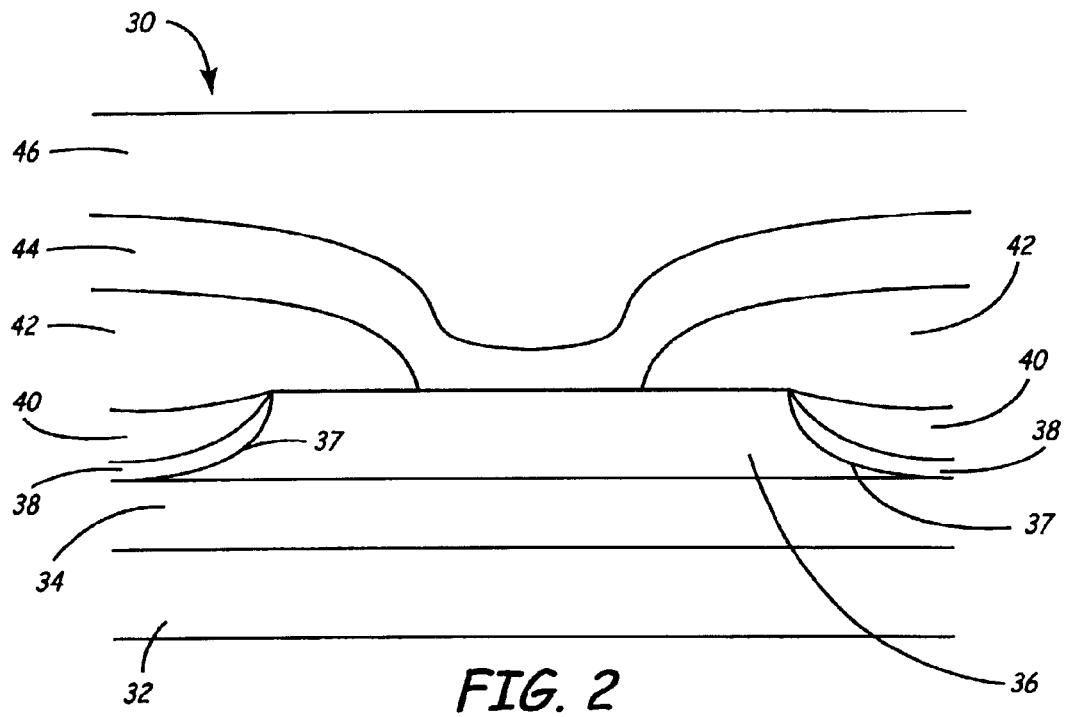
FIG. 2 shows a GMR sensor of the prior art.

FIG. 2 shows GMR sensor 30 of the prior art. GMR sensor 30 includes bottom shield 32, bottom reader gap 34, GMR stack 36, permanent magnet seed layers 38, permanent magnet biasing elements 40, current leads 42, top reader gap 44, and top shield 46. GMR sensor 30 is known as a contact overlay design reader and is shown in FIG. 2 viewed from the air bearing surface (ABS). Formation of GMR sensor 30 is accomplished by first forming bottom shield 32 and smoothing it with a chemical mechanical polishing operation. Bottom reader gap 34 is then deposited onto bottom shield 32. Depositing bottom reader gap 34 is usually accomplished by a reactive RF sputtering process. GMR stack 36 is then deposited onto bottom reader gap 34 by magnetron sputtering in sputtering systems with high or ultra-high vacuum base pressure.

Next, a photoresist bridge pattern is formed, which is then used to define the width of GMR stack 36 or the "reader width". The reader width is the dimension of GMR stack 36 that is parallel to the ABS and is defined by sides 37 of GMR stack 36 shown in FIG. 2. The reader width is established by using ion beam milling of GMR stack 36 in the areas where it is not protected by the photoresist bridge. Permanent magnet biasing elements 40 are deposited, after the milling operation, using permanent magnet seed layers 38. Next, contact leads 42 are formed over GMR stack 36 and over permanent magnet biasing elements 40.

An additional ion milling operation is then used to define GMR stack 36 height or the "stripe height". The stripe height is the dimension of GMR stack 36 that is perpendicular to the ABS. Finally, top reader gap 44 and top shield 46 are deposited over GMR stack 36 and contact leads 42.

GMR sensor 30 has a number of advantages. For example, it has good read-back amplitude and excellent magnetic stability. The large amplitude results from the fact that permanent magnetic biasing elements 40 are recessed relative to contact leads 42 such that the longitudinal magnetic bias is smaller. The excellent magnetic stability is due to the large aspect ratio, that is, reader width to stripe height. Magnetic stability is further enhanced by the fact that it is possible to stabilize the free layer edges by using a thick permanent magnet biasing element 40 without affecting reader sensitivity. The disadvantages of GMR sensor 30 are that it requires a complex photoresist process with two milling operations, it presents difficulty in achieving acceptable reader widths, and it has increased side reading. The enlarged electrical reader width and side reading are the result of the incomplete confinement of the bias current as well as the propagation of the side magnetic disturbances through the free layer because of the strong exchange coupling between the magnetic moment in the free layer.

Figure 3:
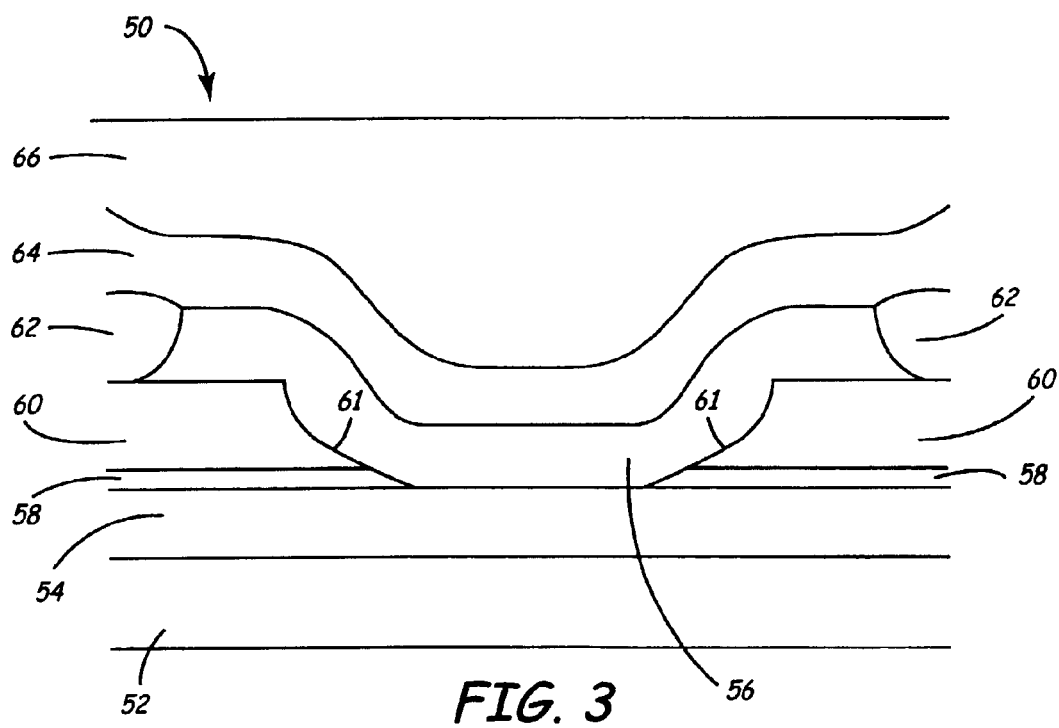
FIG. 3 shows another GMR sensor of the prior art.

FIG. 3 shows another GMR sensor 50 of the prior art. GMR sensor 50 includes bottom shield 52, bottom reader gap 54, GMR stack 56, permanent magnet seed layers 58, permanent magnet biasing elements 60, current leads 62, top reader gap 64, and top shield 66. GMR sensor 50 is known as a permanent magnet overlay design reader and is shown in FIG. 3 viewed from the ABS. Formation of GMR sensor 50 with respect to bottom shield 52 and bottom reader gap 54 is similar to the formation of GMR sensor 30 described above. Next, the permanent magnet seed layers 58 and permanent magnet biasing elements 60 are deposited directly onto the bottom reader gap 54. Next, a photoresist pattern is used to define the desired reader width of GMR stack 56. The photoresist pattern for GMR sensor 50 is opposite that of the one used for GMR sensor 30, in that it exposes a central area and protects the sides. A mill operation is then used to clear permanent magnet biasing element 60 in a center region to create sloped edges 61 of the permanent magnet biasing element 60. After the photoresist pattern is removed, GMR stack 56 is deposited. Contact leads 62, top reader gap 64, and top shield 66 are then added in a process similar to that described above with respect to GMR sensor 30.

The main advantage of GMR sensor 50 is improved magnetic head stability. The improved stability is a result of an improved reader width to stripe height aspect ratio as well as a wider region over which the permanent magnet biasing elements 60 are stabilizing the free layer of GMR stack 56 due to sloped edges 61 of the permanent magnet biasing elements 60. The main disadvantage of GMR sensor 50 is that sloped edges 61 of the permanent magnet biasing elements 60 are very critical dimensions, and are very difficult to optimize. If the slope is to steep it will create problems with GMR stack 56 and create stability issues. If the slope is to shallow it will cause variability in the reader width and cause side reading. In either case, the sloped edges 61 create a thin region that contributes to magnetic instability.

Figure 4:
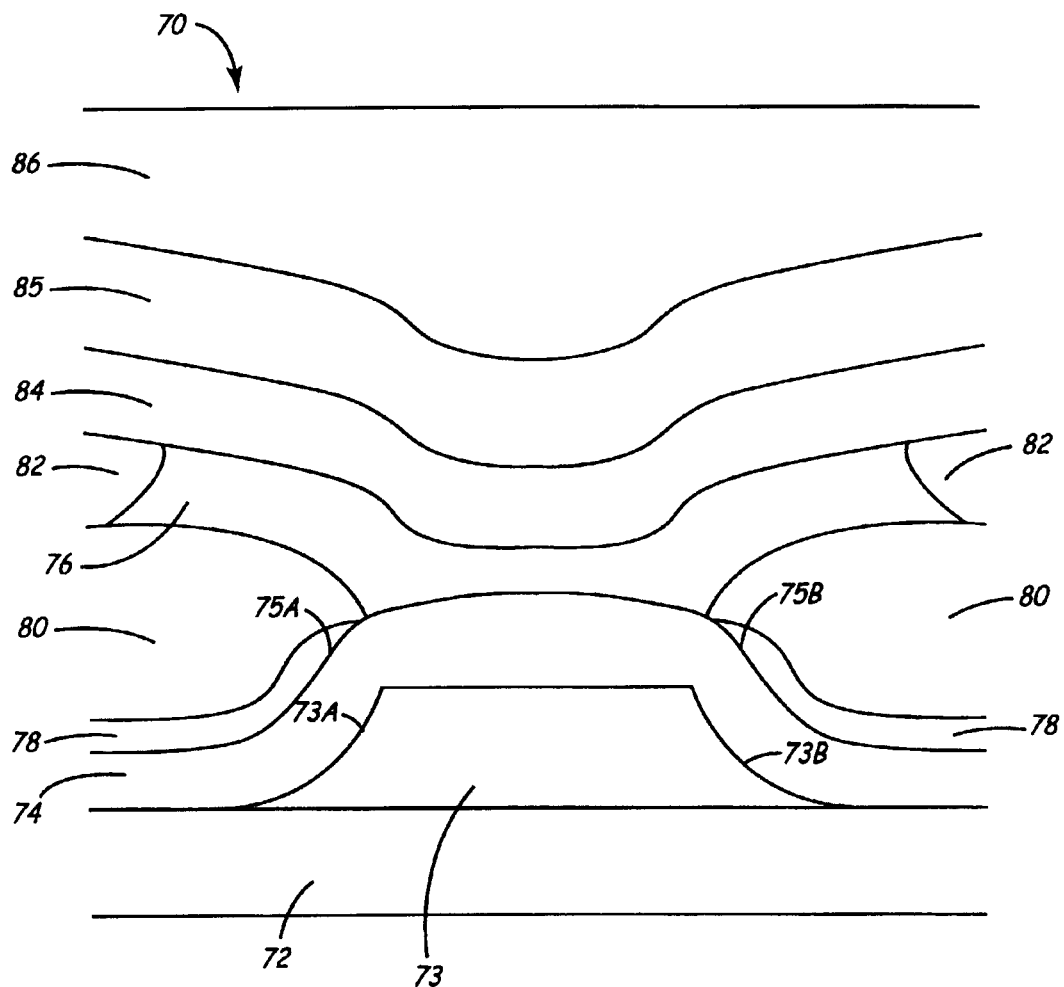
FIG. 4 shows a GMR sensor in accordance with the present invention.

FIG. 4 shows GMR sensor 70 in accordance with the present invention. GMR sensor 70 includes bottom shield 72, nonmagnetic metallic pedestal 73, bottom reader gap 74, GMR stack 76, permanent magnet seed layers 78, permanent magnet biasing elements 80, current leads 82, top nonmagnetic metallic layer 85, and top shield 86. GMR sensor 70 may be referred to as an inverted permanent magnet overlay design, and is shown in FIG. 4 viewed from the ABS.

Formation of GMR sensor 70 is accomplished by first forming bottom shield 72 similarly to that described above with respect to sensors 30 and 50. Next, a nonmagnetic metallic pedestal 73 is deposited on bottom shield 72. Subsequently, a photoresist bridge pattern is formed over nonmagnetic metallic pedestal 73 in all areas except within a desired area for the reader width. Next, nonmagnetic metallic pedestal 73 is milled away from all the areas where it is not needed leaving behind nonmagnetic metallic pedestal 73 between sloped sides 73a and 73b. Next, bottom reader gap 74 is formed over nonmagnetic metallic pedestal 73 and bottom shield 72. Bottom reader gap can be formed using a conventional non-collimated reactive RF deposition process or using an atomic layer deposition process. Using a conventional non-collimated reactive RF process allows deposition of a significant amount of $Al_2O_3$ under the narrow photoresist bridge. This process has the disadvantage of requiring a thick (at least 150 Å) reader gap for good isolation. Using the atomic layer deposition process allows a significantly thinner bottom reader gap that will grow uniformly.

Nonmagnetic metallic pedestal 73 includes sloped sides 73a and 73b, which create an advantageous shape of bottom reader gap 74. Since bottom reader gap 74 is formed over nonmagnetic metallic pedestal 73, it follows the slope of nonmagnetic metallic pedestal sides 73a and 73b. Thus, bottom reader gap 74 similarly defines sloped sides 75a and 75b. This unique sloped shape of bottom reader gap 74 with sloped sides 75a and 75b provides advantages in GMR sensor 70.

Forming permanent magnet seed layer 78, permanent magnet biasing elements 80, GMR stack 76, contact leads 82, and top reader gap 84 is accomplished in a similar way to that described above with respect to GMR sensor 50. When permanent magnet seed layers 78 are used to form permanent magnet biasing elements 80, however, they are formed on sloped sides 75a and 75b of bottom reader gap 74. Forming permanent magnet biasing elements 80 in the region of sloped sides 75a and 75b significantly reduces the thin region of the permanent magnet biasing elements 80, and leads to more magnetic stability than prior designs. Finally, top nonmagnetic metallic layer 85 is deposited over top reader gap 84, and top shield 86 is deposited over top nonmagnetic metallic layer 85.

GMR sensor 70 in accordance with the present invention has several advantages. The fabrication of GMR sensor 70 does not require any milling of bottom reader gap 74 when GMR stack 76 is defined. This will allow for a much thinner bottom reader gap 74. Ordinarily, where milling over the bottom reader gap is required, the bottom reader gap must be thick enough to ensure that milling does not penetrate through the bottom reader gap. Since there is no milling over bottom reader gap 74 in the present invention, bottom reader gap 74 may be formed very thin. In achieving such a thin bottom reader gap, GMR sensor 70 has the advantage of improved heat dissipation. Because bottom reader gap 74 is thinner, heat generated in GMR sensor 70 travels a shorter distance through the isolating reader gaps.

In addition, nonmagnetic metallic pedestal 73 has high thermal conductivity. This further improves the heat dissipation of GMR sensor 70 by allowing nonmagnetic metallic pedestal 73 to conduct heat out of GMR sensor 70. Top reader gap 84 can also be thin (100 Å) to facilitate fast heat dissipation. Top nonmagnetic metallic layer 85 also has high thermal conductivity and is placed between top reader gap 84 and top shield 86 to further improve heat dissipation of GMR sensor 70. The overall increased heat dissipation of GMR sensor 70 increases the voltage across the active sensor part and thereby increases the read-back amplitude of the sensor.

GMR sensor 70 also benefits from a larger reader width to stripe height aspect ratio than previous designs. Since GMR stack 76 overlays permanent magnet biasing elements 80 rather than lying between them, it has a relatively large width, which enhances the stability and reader amplitude of sensor 70. Nonmagnetic metallic pedestal 73 also increases the physical separation between top and bottom shields 86 and 72 further enhancing the stability and reader amplitude of sensor 70.

GMR sensor 70 also has a large physical range over which the free layer is stabilized. The free layer in the portions of GMR stack 76 that overlay permanent magnet biasing elements 80 are pinned such that only the free layer in the portions of GMR stack 76 between permanent magnet biasing elements 80 actually move in response to moving magnetic fields. Stabilizing the free layer in this large physical range also contributes to better magnetic stability and good reader amplitude.

Although the present invention has been described with reference to preferred embodiments, workers skilled in the art will recognize that changes may be made in form and detail without departing from the spirit and scope of the invention. For example, alternative biasing elements, other than permanent magnet seed layers 78 and permanent magnet biasing elements 80, can also be used in accordance with the present invention. For example, antiferromagnetic exchange tabs can be place proximate to GMR stack 76 similar to where permanent magnet biasing elements 80 are places as described above. With this alternative, GMR sensor 70 will still have a large physical range over which the free layer is stabilized. The free layer in the portions of GMR stack 76 that overlay the exchange tabs will be pinned such that only the free layer in the portions of GMR stack 76 between the exchange tabs will actually move in response to moving magnetic fields.

What is claimed is:

1. A magnetic data storage and retrieval system including a magnetic reader and a magnetic storage media having a generally planar surface, the magnetic storage media having information stored thereon, the magnetic reader having an air bearing surface generally parallel to the surface of the magnetic media, the magnetic reader further comprising:

a bottom shield with a width generally parallel to the air bearing surface;

a nonmagnetic metallic pedestal positioned on a first portion of the bottom shield, the nonmagnetic metallic pedestal having a width generally parallel to the air bearing surface that is less than the width of the bottom shield such that the nonmagnetic metallic pedestal is not on a second portion of the bottom shield;

a bottom reader gap layer positioned over the nonmagnetic metallic pedestal and on the bottom shield;

a biasing element positioned on the bottom reader gap layer;

a magnetoresistive stack positioned on the bottom reader gap layer;

current leads positioned adjacent the magnetoresistive stack;

a top reader gap layer positioned on the magnetoresistive stack; and a top shield.

2. The magnetic data storage and retrieval system of claim 1 wherein the nonmagnetic metallic pedestal defines first and second sloped pedestal sides.

3. The magnetic data storage and retrieval system of claim 2 wherein the bottom reader gap defines first and second sloped gap sides.

4. The magnetic data storage and retrieval system of claim 3 wherein the first and second sloped gap sides are defined by a transition of the bottom reader gap from the nonmagnetic metallic pedestal to the bottom shield.

5. The magnetic data storage and retrieval system of claim 3 wherein the biasing element is positioned on the sloped gap sides of the bottom reader gap.

6. The magnetic reader of claim 1 further comprising a top nonmagnetic metallic layer positioned between the top reader gap layer and the top shield.

7. The magnetic reader of claim 1 wherein the top and bottom shields are a soft magnetic material.

8. A magnetoresistive (MR) sensor comprising:

a bottom shield having a width, a thickness, and a height;

a nonmagnetic metallic pedestal positioned on a portion of the bottom shield, the nonmagnetic metallic pedestal having a width less than the width of the bottom shield;

a bottom reader gap positioned on the nonmagnetic metallic pedestal and on the bottom shield such that a portion of the bottom reader gap over the nonmagnetic metallic pedestal is raised relative to portions of the bottom reader gap over the bottom shield;

a biasing element positioned on the bottom reader gap;

a magnetoresistive stack positioned on the bottom reader gap and on the biasing element;

current leads positioned adjacent the magnetoresistive stack;

a top reader gap positioned on the magnetoresistive stack; and a top shield positioned over the top reader gap.

9. The MR sensor of claim 8 wherein the nonmagnetic metallic pedestal defines first and second sloped pedestal sides.

10. The MR sensor of claim 8 wherein the bottom reader gap defines first and second sloped gap sides.

11. The MR sensor of claim 10 wherein the first and second sloped gap sides are defined by a transition of the bottom reader gap from the nonmagnetic metallic pedestal to the bottom shield.

12. The MR sensor of claim 10 wherein the permanent magnet element is positioned on both the sloped gap sides of the bottom reader gap.

13. The MR sensor of claim 12 wherein the magnetoresistive stack is positioned between the biasing element on the sloped gap sides of the bottom reader gap.

14. The MR sensor of claim 8 wherein the magnetoresistive stack is a giant magnetoresistive sensor.

15. The MR sensor of claim 8 further comprising a top nonmagnetic metallic layer positioned between the top reader gap layer and the top shield.

16. An improved magnetoresistive (MR) sensor including a magnetoresistive stack, the improvement comprising:
 a nonmagnetic metallic pedestal positioned under a bottom reader gap having a width, the nonmagnetic metallic pedestal having a width smaller than the width of the bottom reader gap such that the relative widths of the nonmagnetic metallic pedestal and the bottom reader gap causes a portion of the reader gap to be in a first plane and a second portion of the reader gap to be in a second plane that is different than the first plane.

17. A magnetic device comprising a multilayer stack characterized by a nonmagnetic metallic pedestal, the multilayer stack including a reader gap positioned over the nonmagnetic metallic pedestal such that a portion of the reader gap over the nonmagnetic metallic pedestal is raised relative to portions of the reader gap not over the nonmagnetic metallic pedestal.

18. The magnetic device of claim 17 wherein the multilayer stack includes a shield, the nonmagnetic metallic pedestal positioned on portion of the shield.

19. The magnetic device of claim 18 wherein the nonmagnetic metallic pedestal has a width less than the width of the shield.

20. The magnetic device of claim 18 wherein the nonmagnetic metallic pedestal defines first and second sloped pedestal sides.

21. The magnetic device of claim 20 wherein the reader gap defines first and second sloped gap sides.

22. The magnetic device of claim 21 wherein the first and second sloped gap sides are defined by a transition of the reader gap from the nonmagnetic metallic pedestal to the shield.

23. The magnetic device claim 17 wherein the device is a magnetoresistive sensor.

24. A magnetic data storage and retrieval system including a magnetic reader and a magnetic storage media having a generally planar surface, the magnetic storage media having information stored thereon, the magnetic reader having an air bearing surface generally parallel to the surface of the magnetic media, the magnetic reader further comprising:
 a bottom shield with a width generally parallel to the air bearing surface;
 a nonmagnetic metallic pedestal positioned on a first portion of the bottom shield, the nonmagnetic metallic pedestal having a width generally parallel to the air bearing surface that is less than the width of the bottom shield such that the nonmagnetic metallic pedestal is not on a second portion of the bottom shield;
 a bottom reader gap layer positioned on the nonmagnetic metallic pedestal and on the bottom shield;
 a biasing element positioned on the bottom reader gap layer;
 a magnetoresistive stack positioned on the bottom reader gap layer;
 current leads positioned adjacent the magnetoresistive stack;
 a top reader gap layer positioned on the magnetoresistive stack;
 a top nonmagnetic metallic layer positioned on the top reader gap layer; and
 a top shield positioned on the top nonmagnetic metallic layer.

25. A magnetic device comprising a multilayer stack characterized by a nonmagnetic metallic pedestal, the multilayer stack including a shield, the nonmagnetic metallic pedestal positioned on a portion of the shield, the multilayer stack further including a reader gap positioned on the nonmagnetic metallic pedestal such that a portion of the reader gap on the nonmagnetic metallic pedestal is raised relative to portions of the reader gap not on the nonmagnetic metallic pedestal.

* * * * *